(12) United States Patent
Miya

(10) Patent No.: US 8,075,731 B2
(45) Date of Patent: Dec. 13, 2011

(54) SUBSTRATE PROCESSING APPARATUS AND A SUBSTRATE PROCESSING METHOD

(75) Inventor: Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 475 days.

(21) Appl. No.: 12/259,567

(22) Filed: Oct. 28, 2008

(65) Prior Publication Data
US 2009/0107400 A1    Apr. 30, 2009

(30) Foreign Application Priority Data
Oct. 31, 2007 (JP) ................ 2007-282961

(51) Int. Cl.
C23C 16/00 (2006.01)
H01L 21/304 (2006.01)
(52) U.S. Cl. ............. 156/345.33; 118/715; 427/248.1
(58) Field of Classification Search ........... 118/715, 118/728, 730; 156/345.55, 345.29, 345.26, 156/345.21, 345.33; 427/248.1
See application file for complete search history.

(56) References Cited

U.S. PATENT DOCUMENTS

| | | | |
|---|---|---|---|
| 6,193,798 B1 | 2/2001 | Sumnitsch | |
| 6,807,974 B2 | 10/2004 | Ono et al. | |
| 7,029,538 B2 | 4/2006 | Ono et al. | |
| 2002/0074020 A1 | 6/2002 | Ono et al. | |
| 2003/0047192 A1 | 3/2003 | Ono et al. | |
| 2006/0130872 A1 | 6/2006 | Izumi et al. | |
| 2009/0107400 A1* | 4/2009 | Miya | 118/715 |
| 2009/0162547 A1* | 6/2009 | Sawada et al. | 427/240 |

FOREIGN PATENT DOCUMENTS

| | | |
|---|---|---|
| JP | 9-97757 | 4/1997 |
| JP | 11-54472 | 2/1999 |
| JP | 11-345763 | 12/1999 |
| JP | 2004-119717 | 4/2004 |
| JP | 2005-340462 | 12/2005 |
| JP | 2006-120817 | 5/2006 |
| JP | 2006-179550 | 7/2006 |
| JP | 2007-189185 | 7/2007 |
| KR | 10-2002-0044536 | 6/2002 |

OTHER PUBLICATIONS

Chinese Office Action issued Feb. 5, 2010 in connection with corresponding Chinese Patent Application No. 200810175127.1.
Korean Office Action issued Aug. 4, 2010 in connection with corresponding Korean Patent Application No. 2008-100608.
Notice of Allowance mailed Nov. 30, 2010 in connection with corresponding Korean Patent Application No. 2008-0100608 (The first two Japanese references were cited in an Information Disclosure Statement filed Sep. 2, 2010 and are therefore not enclosed.).

* cited by examiner

Primary Examiner — Sylvia R. MacArthur
(74) Attorney, Agent, or Firm — Ostrolenk Faber LLP

(57) ABSTRACT

A gas injection head 200 is provided above a substantial center of a substrate W. Nitrogen gas introduced from a gas feed port 291 is injected from a slit-shaped injection port 293 via an internal buffer space BF. In this way, a radial gas flow substantially isotropic in a horizontal direction while having an injection direction restricted in a vertical direction is generated above the substrate. Thus, dust D, mist M and the like around the substrate are blown off in outward directions and do not adhere to the substrate W. The gas injection head 200 can be made smaller than the diameter of the substrate W and needs to be neither retracted from the substrate surface nor rotated, wherefore an apparatus can be miniaturized.

9 Claims, 9 Drawing Sheets

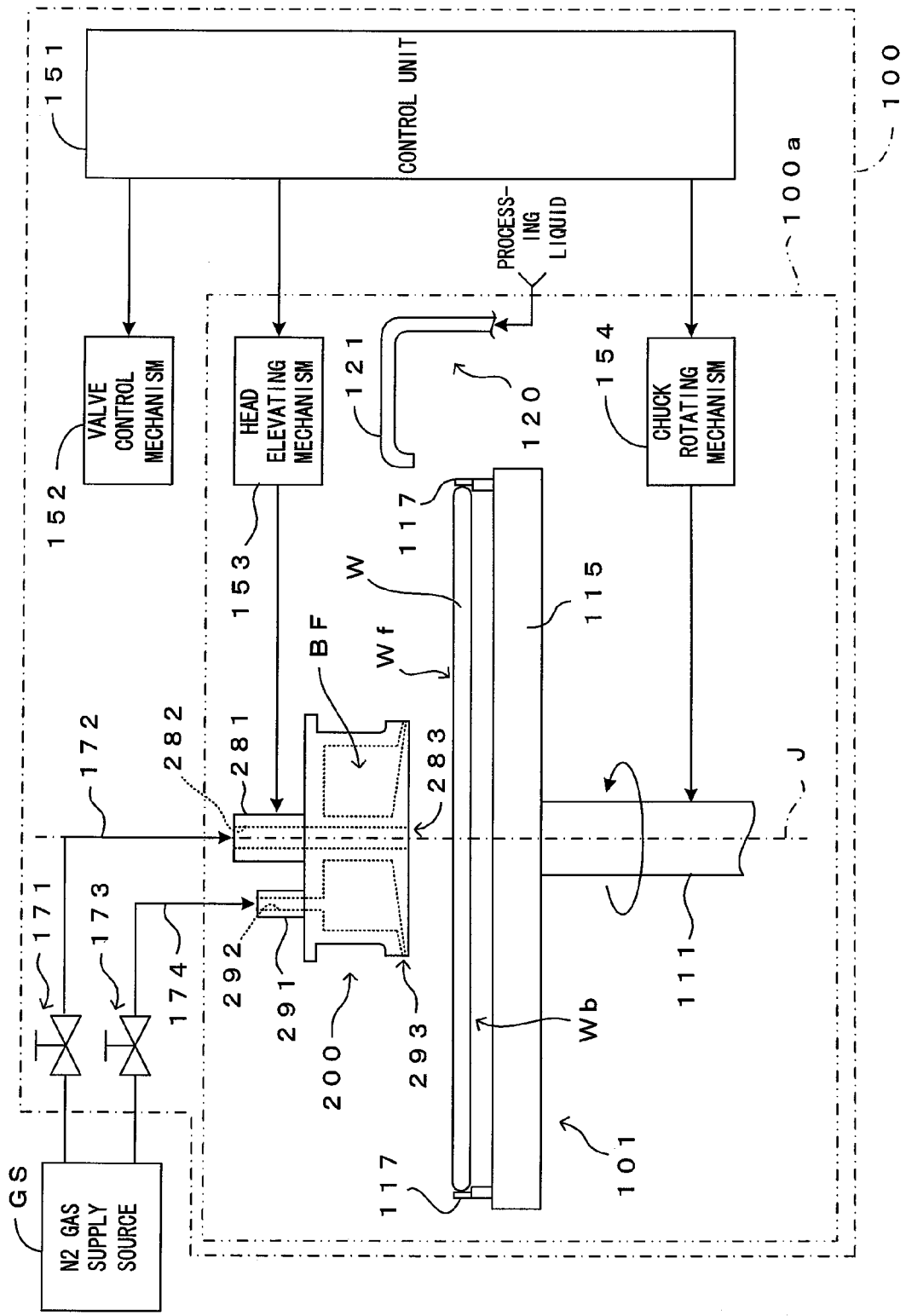
F I G. 2

SUBSTRATE PROCESSING APPARATUS AND A SUBSTRATE PROCESSING METHOD

CROSS REFERENCE TO RELATED APPLICATION

The disclosure of Japanese Patent Application No. 2007-282961 filed on Oct. 31, 2007 including specification, drawings and claims is incorporated herein by reference in its entirety.

BACKGROUND OF THE INVENTION

1. Field of the Invention

The invention relates to a substrate processing apparatus and a substrate processing method for applying a specified processing with a substrate substantially horizontally held. Here, substrates to be processed include semiconductor wafers, glass substrates for photomasks, glass substrates for liquid crystal displays, glass substrates for plasma displays, substrates for FEDs (Field Emission Displays), substrates for optical discs, substrates for magnetic discs and substrates for magneto-optical discs. The processings to be applied to the substrate include a development processing, an etching processing, a cleaning process, a rinsing processing and a drying processing.

2. Description of the Related Art

In a substrate processing apparatus and a substrate processing method for applying a processing with a substrate substantially horizontally held, a blocking member having substantially the same size as or slightly larger than the substrate is arranged at a position above and proximate to the substrate to cover the substrate in order to prevent the adhesion of fallen dust and mist to the upper surface of the substrate and prevent the substrate surface from being exposed to air. For example, according to technology disclosed in JP-A-2006-179550, a blocking plate arranged to face a substrate is provided right above the substrate horizontally held by a spin chuck. This blocking plate is driven and rotated at the same rotation speed in the same rotating direction as the spin chuck. By doing so, a blocking effect of blocking the substrate from dust, mist, outside air and the like is obtained in the conventional technology.

SUMMARY OF THE INVENTION

In the substrate processing apparatus and substrate processing method of this type, it is demanded to further improve the processing throughput, i.e. the number of substrates processed per unit time. As one technique to enable this, more processing units for applying a processing to substrates are installed in the same installation volume to process a multitude of substrates in parallel. To this end, the further miniaturization of the respective processing units are required. However, the above conventional technology had a limit in the miniaturization of the apparatus. This is because, for example, a space for temporarily retracting the blocking plate for the loading and unloading the substrate is necessary and a driving mechanism for rotating and retracting the blocking plate is necessary.

In view of the above problem, an object of the invention is to provide technology suitable for the further miniaturization of an apparatus, in a substrate processing apparatus and a substrate processing method for applying a specified processing with a substrate substantially held, while obtaining a blocking effect similar to the one given by processing technology using a blocking plate.

A substrate processing apparatus according to the invention is for applying a specified processing to a substrate and comprises a substrate holder which holds the substrate substantially horizontally, and a gas injector which is arranged above a substantial center of the substrate held by the substrate holder and radially injects gas, wherein the gas injector injects the gas substantially isotropically in a horizontal direction while restricting an injection direction of the gas to a specified range in a vertical direction.

In the invention thus constructed, the substrate can be processed in a state where a gas flow thin in the vertical direction and substantially isotropic in the horizontal direction is generated to flow from the substantial center of the substrate toward the peripheral portion above the substrate. Thus, dust falling down from the above of the substrate and mist and the like scattered around the substrate as the processing is performed are blown off to the outer side of the peripheral portion of the substrate by this gas flow. In other words, in this invention, the gas flow generated to cover the upper surface of the substrate and flowing from the substantial center of the substantially toward the peripheral portion above the substrate fulfills the same function as the blocking plate in the conventional technology. Since the gas is injected from the above of the substantial center of the substrate toward the surrounding, the gas injector can be made smaller than the substrate and the gas injector needs not be rotated, wherefore the processing apparatus can be drastically simplified and miniaturized as compared with the construction including the rotary blocking plate.

In order to accomplish the above object, a substrate processing method according to the invention comprises a substrate holding step of substantially horizontally holding a substrate, and a processing step of applying a specified processing to the substrate by injecting gas, from the above of a substantial central part of the substrate, substantially isotropically in a horizontal direction while restricting an injection direction to a specified range in a vertical direction. In the invention thus constructed, similar to the above substrate processing apparatus, a gas flow is generated by the gas radially injected from the above of the substrate, whereby the adhesion of dust, mist and the like to the substrate surface can be prevented. Further, since it is not necessary to cover the upper surface of the substrate and to rotate the blocking plate, an apparatus for implementing this substrate processing method can have a smaller construction.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 2 is a diagram showing a first embodiment of a substrate processing unit according to the invention.

DETAILED DESCRIPTION OF THE PREFERRED EMBODIMENTS

Figure 1A:
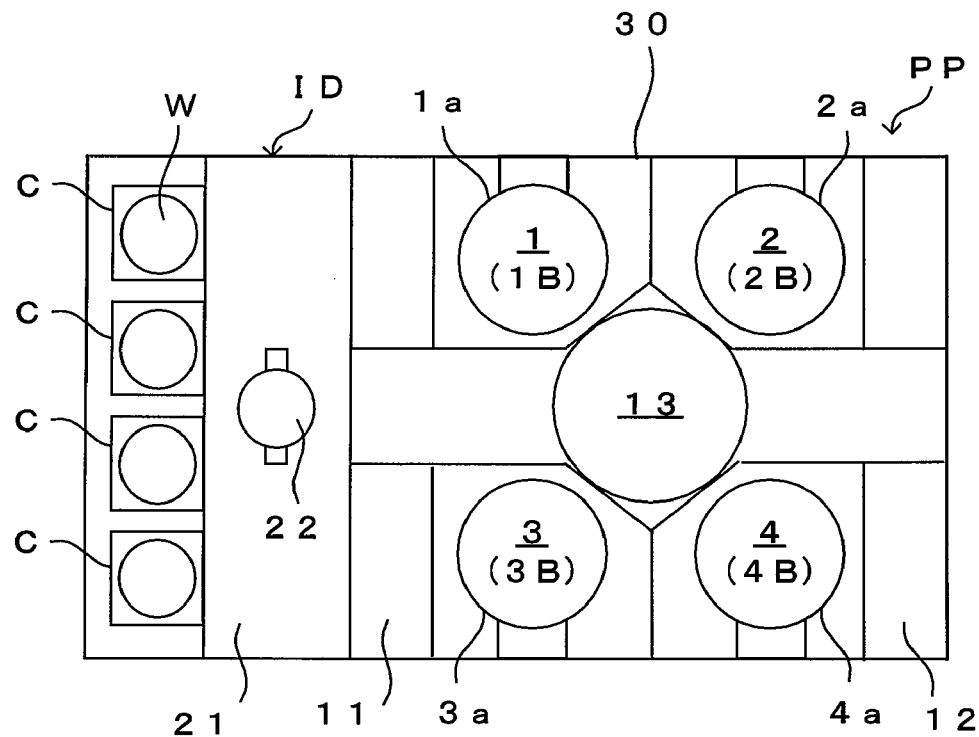
FIGS. 1A and 1B are diagrams showing a substrate processing system, to which the invention is suitably applicable.
Figure 1B:
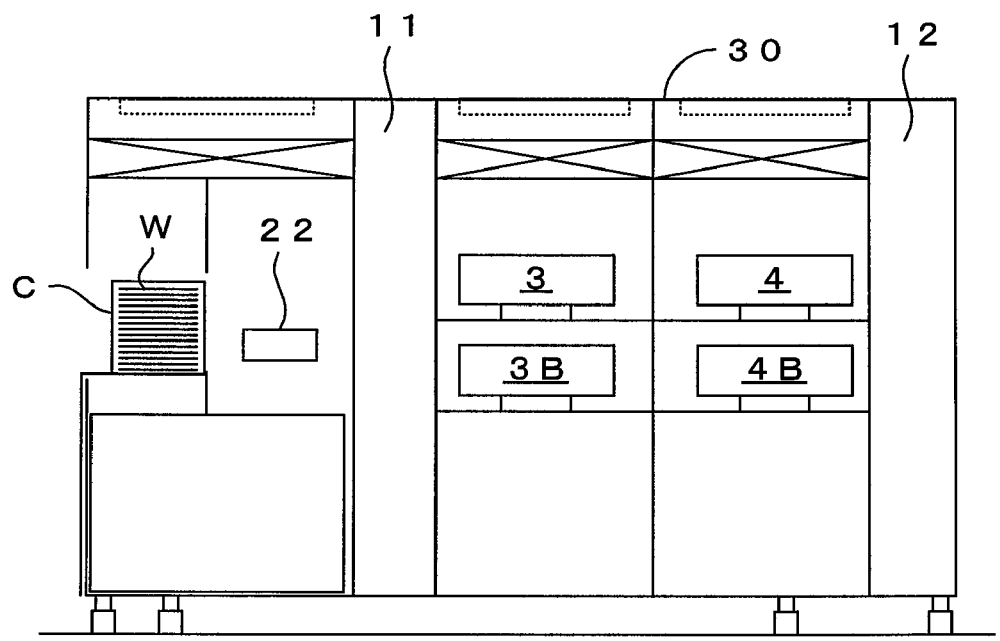

FIGS. 1A and 1B are diagrams showing a substrate processing system, to which the invention is suitably applicable. More specifically, FIG. 1A is a top view of the substrate processing system and FIG. 1B is a side view of the substrate processing system. This substrate processing system includes a plurality of substrate processing units each as a single substrate processing apparatus for applying a processing to substrates W such as semiconductor wafers using a processing liquid or processing gas. This substrate processing system includes a substrate processing station PP for applying a processing to the substrates W, an indexer station ID connected with the substrate processing station PP, and processing fluid boxes 11, 12 accommodating a construction for supplying/discharging the processing fluid (liquid or gas).

The indexer station ID includes a cassette holder 21 capable of holding a plurality of cassettes C (FOUPs (Front Opening Unified Pods), SMIF (Standard Mechanical Interface) pods or OCs (Open Cassettes), etc. for accommodating a plurality of substrates W in a sealed state) for accommodating the substrates W, and an indexer robot 22 for accessing to the cassettes C held by the cassette holder 21 to take the unprocessed substrates W from the cassettes C and to accommodate the processed substrates into the cassettes C.

In each cassette C, a plurality of substrates W are accommodated by the unit called "lot". A plurality of substrates W are conveyed between various substrate processing systems by the lot and the same type of processing is applied to the respective substrates W constituting the lot in each substrate processing system. Each cassette C includes shelves (not shown) in a plurality of levels for holding a plurality of substrates W while placing them one above another in a vertical direction with small clearances defined therebetween, and one substrate W can be held on the shelf of each level. The shelf of each level holds the substrate W from below while being held in contact with the periphery of the lower surface of the substrate W. The substrates W are accommodated in the cassette C in substantially horizontal postures that the top surfaces (pattern-formed surfaces) thereof are faced upward and the under surfaces thereof are faced downward.

The substrate processing station PP includes a substrate conveyor robot (substrate conveyor apparatus) 13 arranged substantially in the center in plan view, and a frame 30 on which the substrate conveyor robot 13 is mounted. As shown in FIG. 1A, a plurality of (four in this embodiment) processing units 1, 2, 3 and 4 are horizontally mounted on this frame 30 to surround the substrate conveyor robot 13. In this embodiment, processing units for applying a specified processing to the substantially round substrates W such as semiconductor wafers are mounted on the frame 30 as the processing units 1 to 4. Further, as shown in FIG. 1B, another processing unit is installed below each processing unit. In FIG. 1B, processing units 3B and 4B respectively provided below the processing units 3 and 4 are shown, but processing units 1B and 2B are also similarly respectively provided below the processing units 1 and 2. In this substrate processing system, a total of eight processing units are mounted on the frame 30 with four processing units mounted in each level.

Chemical processing units for applying a chemical processing using a chemical and a rinsing processing using a rinsing liquid such as pure water to the substrates W can be, for example, employed as the processing units. The chemical and the rinsing liquid are called "processing liquids" when being collectively called. The respective processing units 1, 2, 3 and 4 include processing chambers 1a, 2a, 3a and 4a each internally formed with a processing space where the processing is applied to the substrates W. The processing liquid is supplied to the substrates W in the respective processing chambers 1a to 4a to apply a wet processing to the substrates W. The same holds for the processing units provided in the lower level. As described above, in this embodiment, the same type of processing is applied in all of the plurality of processing units.

The substrate conveyor robot 13 can receive the unprocessed substrates W from the indexer robot 22 and can transfer the processed substrates W to the indexer robot 22. More specifically, the substrate conveyor robot 13 includes, for example, a pedestal fixed to the frame 30 of the substrate processing station PP, an elevating base mounted on the pedestal movably upward and downward, a rotating base mounted on the elevating base rotatably about a vertical axis, and a pair of hands attached to the rotating base. The pair of substrate holding hands are respectively constructed to be movable back and forth in directions toward and away from an axial line of rotation of the rotating base. By such a construction, the substrate conveyor robot 13 can direct the substrate holding hands toward any one of the indexer robot 22 and the processing units 1 to 4, 1B to 4B and can move the substrate holding hands forward and backward. In this way, the substrates W can be transferred.

The indexer robot 22 takes the unprocessed substrates W from the cassette C specified by a controller and transfers them to the substrate conveyor robot 13, and receives the processed substrates W from the substrate conveyor robot 13 and accommodates them in the cassette C. The processed substrates W may be accommodated in the cassette C in which they were accommodated in an unprocessed state. Alternatively, different cassettes may be prepared as the cassettes for accommodating the unprocessed substrates W and the cassettes for accommodating the processed substrates W, so that the processed substrates W are accommodated in the cassette C different from the cassette C in which these substrates W were accommodated in the unprocessed state.

Next, two embodiments of the processing unit installed in the above substrate processing system are described. Although eight processing units are installed n the substrate processing system of FIG. 1, any of these processing units may have the same construction as a processing unit 100 to be described below.

First Embodiment

FIG. 2 is a diagram showing a first embodiment of a substrate processing unit according to the invention. This substrate processing unit 100 is a substrate processing unit of the single wafer type which is used in cleaning processing which is for removing undesired substance adhering to a surface Wf of a substrate W such as a semiconductor wafer. To be more specific, this is a processing unit in which after chemical processing with a chemical solution of a hydrofluoric acid or the like and rinsing processing with a rinsing liquid such as purified water or DIW (deionized water) are performed to the substrate surface Wf, the substrate surface Wf which is wet with the rinsing liquid is dried. Meanwhile, in this embodiment, the substrate surface Wf is a pattern-formed surface on which a device pattern is formed.

The substrate processing unit 100 comprises a spin chuck 101 which holds and rotates the substrate W approximately horizontally in a condition that the surface Wf is directed toward above. A rotation column 111 of the spin chuck 101 is linked to a rotation shaft of a chuck rotating mechanism 154 which contains a motor. The spin chuck 101 is rotatable about a vertical axis J when driven by the chuck rotating mechanism 154. A disk-shaped spin base 115 is connected by a fastening component such as a screw to a top end portion of the rotation column 111 as one integrated unit. The spin base 115 therefore rotates about the vertical axis J by driving the chuck rotating mechanism 154 in response to an operation command received from a control unit 151 which controls the entire apparatus. The control unit 151 controls the chuck rotating mechanism 154 in order to adjust the rotation speed.

Plural chuck pins 117 for holding the substrate W at the rim thereof are disposed upright in the vicinity of the rim of the spin base 115. There may be three or more chuck pins 117 to securely hold the disk-shaped substrate W, and the chuck pins 117 are arranged at equal angular intervals along the rim of the spin base 115. Each chuck pin 117 comprises a substrate support part which supports the substrate W at the rim thereof from below and a substrate holding part which presses the substrate W at the outer peripheral edge surface thereof to hold the substrate W. Each chuck pin 117 is structured so as to be capable of switching between a pressing state that the substrate holding part presses the substrate W at the outer peripheral edge surface thereof and a released state that the substrate holding part stays away from the outer peripheral edge surface of the substrate W.

The plural chuck pins 117 are in the released state while the substrate W is being transferred to the spin base 115 but in the pressing state for cleaning of the substrate W. When in the pressing state, the plural chuck pins 17 hold the substrate W at the rim thereof and keep the substrate approximately horizontally at a predetermined distance from the spin base 115. The substrate W is held with its front surface (pattern-formed surface) Wf directed toward above and its back surface Wb toward below. Meanwhile, the substrate holder is not limited to the chuck pins 117. A vacuum chuck which holds the substrate W by vacuuming a substrate rear surface Wb may be used as the substrate holder.

By driving and rotating the spin chuck 101 holding the substrate W at a specified rotation speed by the chuck rotating mechanism 154, the processing liquid is supplied to the substrate surface Wf from a processing liquid supply nozzle to be described below to apply a specified wet processing (chemical processing and rinsing processing).

A processing liquid supplier 120 is provided lateral to the spin chuck 101. The processing liquid supplier 120 includes a supply nozzle 121 and an unillustrated turning mechanism for turning the supply nozzle 121 between a position facing the center of the substrate W and a standby position lateral to the spin chuck 101. The supply nozzle 121 is connected to an unillustrated processing liquid supply source via a pipe, so that the rinsing liquid and the chemical can be switchingly supplied as the processing liquid.

A gas injection head 200 is provided above a substantially central part of the substrate W. Gas feed ports 281, 291 for introducing nitrogen gas fed from an external nitrogen gas supply source GS are provided at the top of the gas injection head 200. More specifically, a pipe 172 connected with the external nitrogen gas supply source GS and having an opening/closing valve 171 inserted therein is connected with the gas feed port 281. Further, a pipe 174 connected with the external nitrogen gas supply source GS and having an opening/closing valve 173 inserted therein is connected with the gas feed port 291. The opening and closing of the opening/closing valves 171, 173 are controlled by a valve control mechanism 152 controlled by a control unit 151, and the nitrogen gas supplied from the gas supply source GS is fed to the gas injection head 200 by opening the valves according to needs.

The gas feed port 281 is connected with a gas discharge port 283 having an opening formed in the lower surface of the gas injection head 200 (surface facing the substrate surface Wf) and faced toward the substantial center of the substrate W via a gas supply passage 282. The gas feed port 291 is connected with a buffer space BF formed in the injection head 200. A gas injection port 293 communicating with the buffer space BF is provided in an outer peripheral part of the injection head 200. The structure of the gas injection head 200 is described in more detail later.

The gas injection head 200 is held above the spin base 115 by an unillustrated arm, whereas the arm is connected with a head elevating mechanism 153 controlled by the control unit 151 so as to be movable upward and downward. By such a construction, the gas injection head 200 is positioned at a specified distance (e.g. about 2 to 10 mm) from the surface Wf of the substrate W held by the spin chuck 101. The gas injection head 200, the spin chuck 101, the head elevating mechanism 153 and the chuck rotating mechanism 154 are accommodated in a processing chamber 100a.

Figure 3:
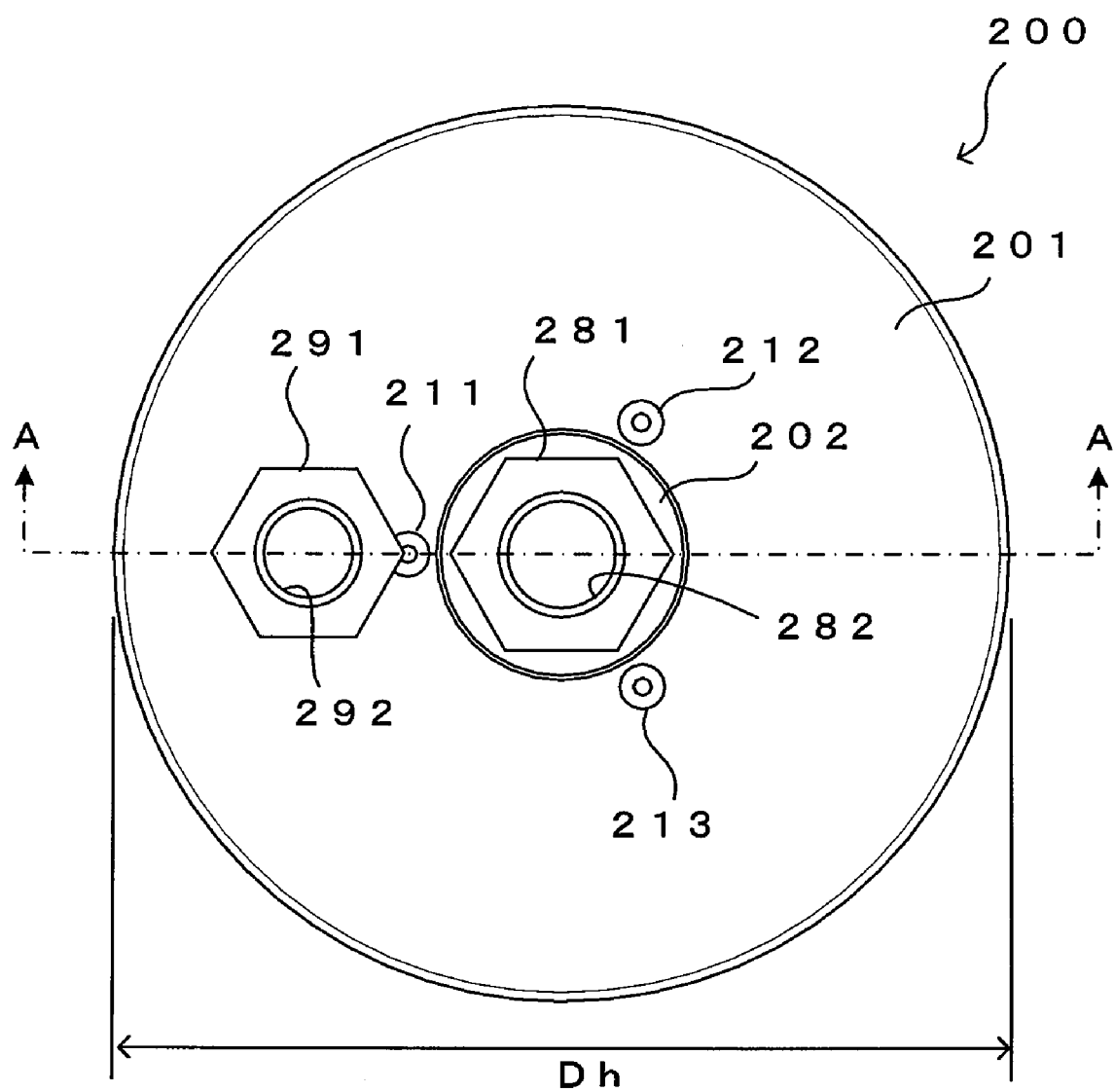
FIG. 3 is a top view of the gas injection head.
Figure 4:
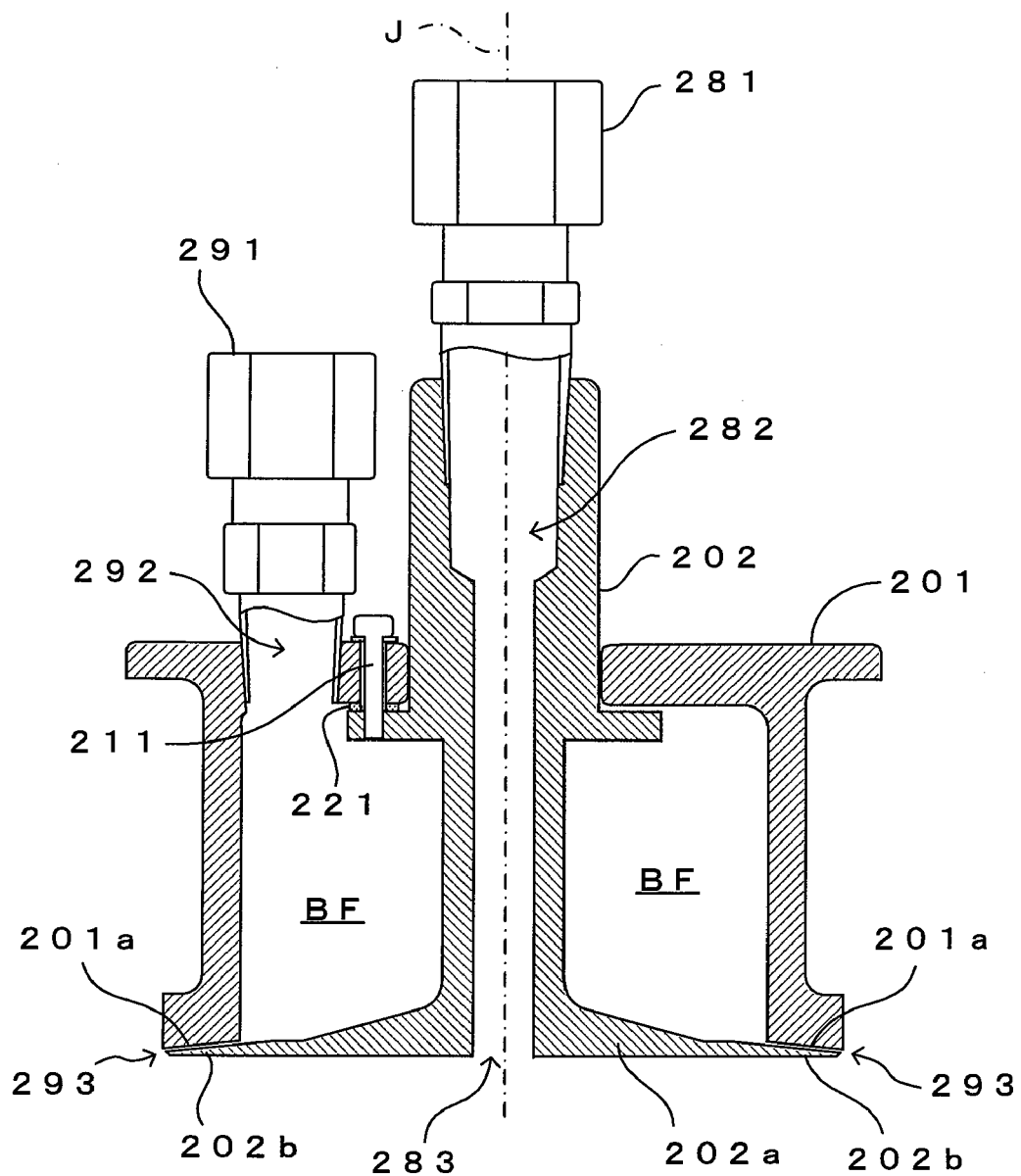
FIG. 4 is a section of the gas injection head along A-A of FIG. 3.

FIG. 3 is a top view of the gas injection head. FIG. 4 is a section of the gas injection head along A-A of FIG. 3. The gas injection head 200 is, as shown in FIG. 4, constructed such that a cup-shaped upper member 201 having a cavity with an open bottom side and a lower member 202 having a flange 202a at the bottom are assembled and fixed by fixing screws 211, 212 and 213. These upper member 201 and lower member 202 are made of metal such as stainless steel or aluminum, and are symmetrically formed substantially with respect to a rotary axis J of the spin chuck 101 except that the upper surface of the upper member 201 is formed with a hole where the gas feed port 291 is provided.

An opening end surface 201a of the upper member 201 and a peripheral portion 202b of the flange 202a of the lower member 202 are formed to face each other. A shim 221 made of, e.g. stainless steel is sandwiched between connecting portions of the upper member 201 and the lower member 202 by the fixing screws 211, etc., whereby a specified gap is formed between the opening end surface 201a of the upper member 201 and the peripheral portion 202b of the lower member 202. By this gap, the slit-shaped gas injection port 293 is formed in the outer circumferential surface of the gas injection head 200. The size of the gap can be adjusted by the thickness of the shim 221 and is, for example, set to about 0.1 mm.

The open bottom side of the cavity formed in the upper member 201 is substantially covered by the flange 202a of the lower member 202. Thus, the buffer space BF enclosed by the upper member 201 and the lower member 202 is formed in the gas injection head 200.

The nitrogen gas fed from the gas supply source GS and introduced through the gas feed port 281 passes in the gas supply passage 282 perforated in the central axis of the lower member 202 substantially coaxially with the rotary axis J of the spin chuck 101 and is discharged from the gas discharge port 283 formed in the lower surface of the lower member 202.

On the other hand, the nitrogen gas fed from the gas supply source GS and introduced through the gas feed port 291 is injected toward the outside through the gap between the upper and lower members after being fed into the buffer space BF formed in the gas injection head 200. At this time, since the nitrogen gas is ejected through the slit-shaped gas injection port 293 extending substantially in the horizontal direction, the spread of the injected nitrogen gas is substantially isotropic in the horizontal direction (circumferential direction) while having its range restricted in the vertical direction. In other words, by the injection of the nitrogen gas from the gas injection port 293, a thin layer of gas flow is generated from a substantially central part to a peripheral part above the substrate W. Particularly, since the pressure-fed gas is temporarily guided into the buffer space BF and is injected therefrom through the gas injection port 293 in this embodiment, a uniform injection amount can be obtained in the circumferential direction. A flow velocity increases by injecting the pressurized nitrogen gas through the small gap, wherefore the nitrogen gas is vigorously injected to the surrounding.

Figure 5:
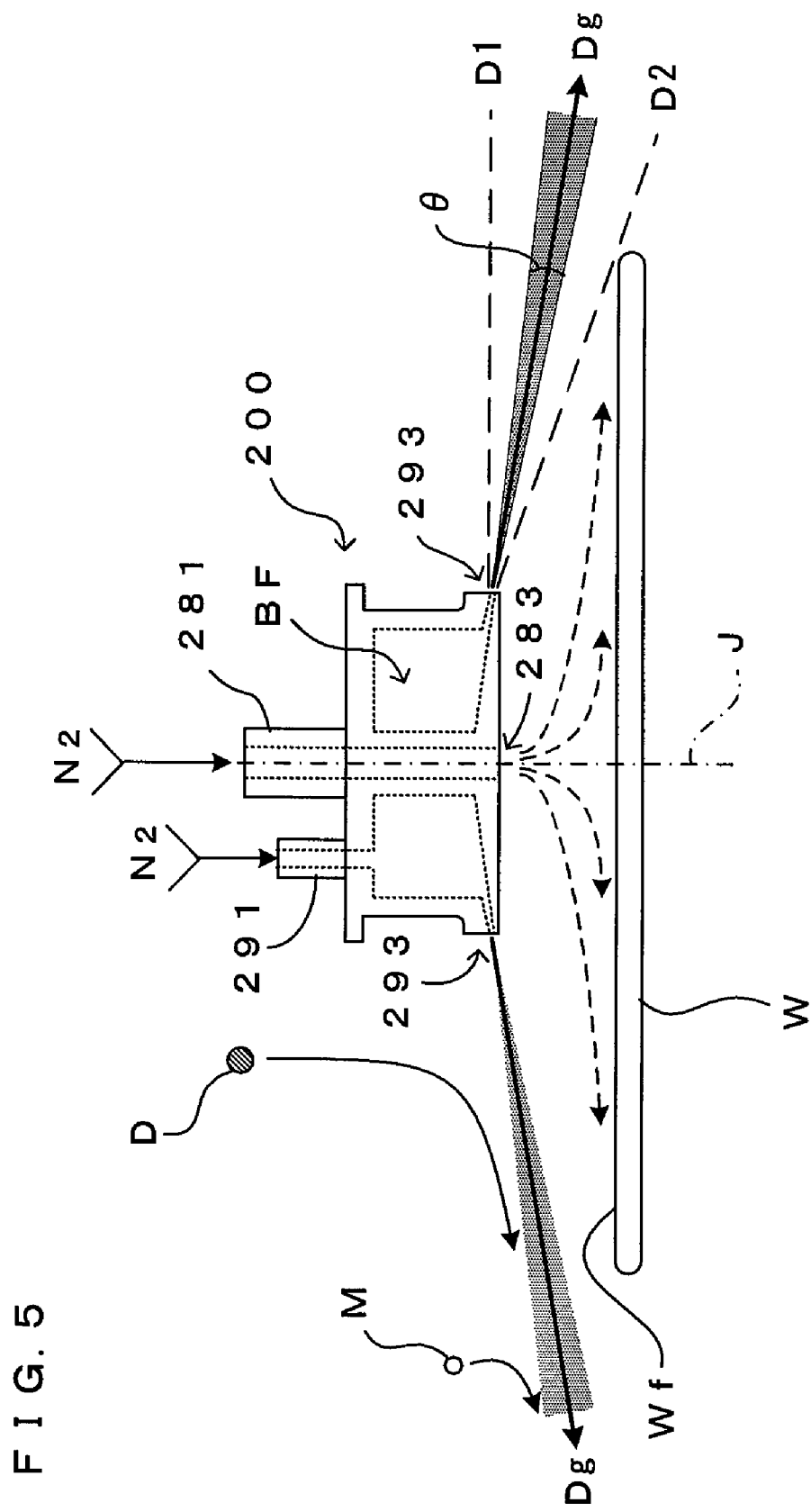
FIG. 5 is a diagram showing a gas flow injected from the gas injection head.

FIG. 5 is a diagram showing a gas flow injected from the gas injection head. As described above, the gas is substantially isotropically injected in the horizontal direction, whereas the injecting direction thereof is restricted in the vertical direction. Specifically, as shown by hatching in FIG. 5, the gas injected from the gas injection port 293 flows in the circumferential direction while vertically spreading little by little with distance from the injection port. This spread angle is expressed by a symbol θ and a center line of the spread, i.e. a direction indicated by a bisector of the spread angle θ is expressed by a symbol Dg below.

By generating the gas flow flowing from the vicinity of the center toward the outer side above the substrate W in this way, dust D falling down from the above of the substrate W, mist M produced around the substrate W as the processing proceeds, etc. are trapped by the gas flow and flowed to the outside as shown by arrows in FIG. 5, thereby being prevented from adhering to the substrate surface Wf.

Technologies for suppressing the adhesion of dust, mist and the like by generating an airflow above a substrate are disclosed, for example, JP-A-2006-120817, JP-A-H11-345763 and JP-A-H09-97757. However, any of the technologies disclosed in these publications relates to the indirect generation of an airflow above a substrate by injecting or sucking gas at a position distant from the substrate, and the effect thereof is quite restrictive. There is also a likelihood of conveying dust, mist and the like generated at other places to the vicinity of the substrate. In contrast, in this embodiment, the pressurized nitrogen gas is injected to the surrounding from the slit-shaped gas injection port 293 formed in the gas injection head 200 arranged right above the substrate W. Thus, the above problem does not occur since a strong outward gas flow is generated near the surface Wf of the substrate W to blow off the mist and the like.

Since the strong gas flow is generated above the surface of the substrate W in this embodiment, the inflow of external atmosphere to the substrate surface Wf can be suppressed. In other words, the gas flow also acts to block the substrate surface Wf from the external atmosphere. Particularly, if inert gas such as nitrogen gas is discharged from the gas discharge port 283 formed in the center of the lower surface of the gas injection head 200 (shown by broken line arrows), atmosphere near the substrate surface Wf is purged to be substituted by the inert gas, wherefore problems such as the oxidation of the substrate W by being exposed to air can be suppressed.

The gas injection direction is preferably such that the direction Dg of the center line is the same as or more downward facing than a horizontal direction D1, but more upward facing than a direction D2 of a straight line connecting the gas injection port 293 and the peripheral portion of the substrate W. If the injection direction is more upward facing than the horizontal direction, falling dust, mist and the like may be stirred up to weaken the effect. If the direction Dg is more downward facing than the direction D2 of the straight line connecting the gas injection port 293 and the peripheral portion of the substrate W, a strong gas flow is blown to the substrate surface Wf, whereby the trapped mist and the like may adhere to the substrate or the processing liquid supplied to the substrate surface Wf is blown off to impair the uniformity of the processing.

In the case of setting the gas injection direction such that the gas flow injected from the gas injection port 293 does not reach the substrate surface Wf, the gas needs not necessarily be the inert gas. Accordingly, for example, the gas injection direction may be set to the horizontal direction and dry air may be injected instead of the nitrogen gas. In this embodiment, the gas discharged from the gas injection port 293 in the circumference of the gas injection head 200 and the gas discharge port 283 formed in the bottom part of the gas injection head 200 is the nitrogen gas supplied from the common nitrogen gas supply source GS. In this way, the substrate W is blocked from the surrounding atmosphere containing oxygen, mist and the like while the simplification of the apparatus construction is promoted.

As described above, the gas flow injected from the circumference of the gas injection head 200 has a blocking function of blocking dust, mist and the like falling down toward the substrate surface Wf and the external atmosphere similar to the blocking member arranged to face the substrate in the substrate processing apparatus according to the above conventional technology. However, since the blocking function is realized by injecting the gas to the surrounding from the gas injection head 200 arranged above the substantial center of the substrate W in this embodiment, it is not necessary to mechanically cover the entire substrate surface unlike the conventional blocking member. Therefore, the gas injection head 200 can be formed smaller than the dimensions of the substrate W. In other words, a diameter Dh (FIG. 3) of the gas injection head 200 can be made smaller than the diameter of the substrate W. For example, if the flow rate and flow velocity of the gas flow are properly set, a sufficient blocking effect can be obtained even if the diameter Dh of the gas injection head 200 is set smaller than the diameter of the substrate W.

Then, upon loading or unloading the substrate W to or from the spin chuck 101 or upon supplying the processing liquid to the substrate surface Wf, the gas injection head 200 needs not be largely retracted. Further upon rotating the substrate, the gas injection head 200 needs not be rotated together. Thus, in addition to being able to miniaturize the gas injection head 200, there is no need for a space for retracting the gas injection head 200 upward and a mechanism for rotating the gas injection head 200. Therefore, the processing unit 100 can be miniaturized, particularly the height thereof can be reduced in this embodiment. Further, since the number of movable parts can be reduced, dust production in the processing chamber 100a can be suppressed.

As a result, as shown in FIG. 1B, the processing units can be installed while being placed one over another in the height direction, and the processings can be performed in parallel by installing many processing units in the same installation area. By doing so, a high substrate processing throughput can be obtained in the substrate processing system including the processing units of this embodiment. Further, the footprint per processing unit can be reduced.

Figure 6:
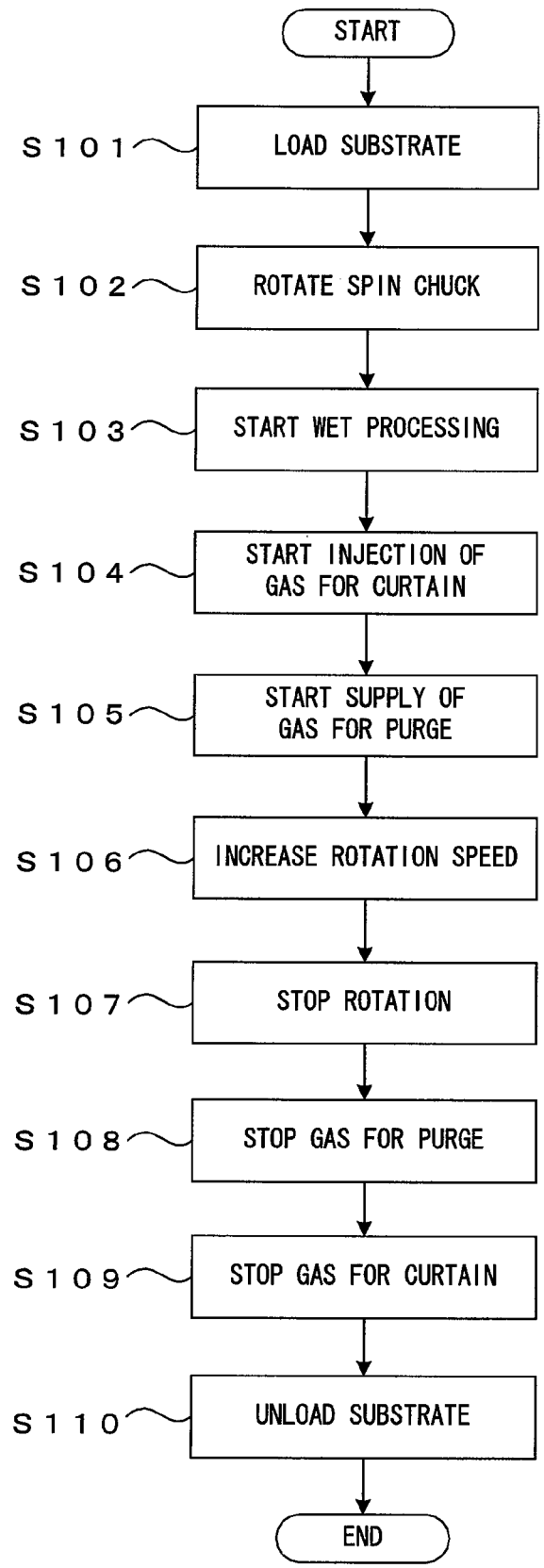
FIG. 6 is a flow chart showing the flow of the substrate processing in the first embodiment.

FIG. 6 is a flow chart showing the flow of the substrate processing in the first embodiment. Before starting the processing, the opening/closing valves 171, 173 are both closed and the spin chuck 101 is stationary. First of all, one substrate W is loaded into the processing unit 100 by the substrate conveyor robot 13, placed on the spin chuck 101 and held by the chuck pin 117 (Step S101; substrate holding step). At this time, if the head elevating mechanism 153 is operated according to needs to move the gas injection head 200 to a position away from the spin chuck 101, the substrate can be more smoothly loaded. However, if the substrate and the gas injection head 200 are at a sufficient distance from each other, the movement of the gas injection head 200 is unnecessary. This also holds for substrate unloading to be described later. At this point of time, the supply nozzle 121 is also moved to the standby position.

At first, the specified processing liquid is supplied to the substrate surface Wf using the processing liquid supplier 120 to perform a wet processing while the spin chuck 101 is rotated (Steps S102, S103). The content of the wet processing is not described here since a known content can be applied. As the wet processing, the rinsing processing is performed after the chemical processing. In the rinsing processing, pure water (or deionized water) is supplied to the rotating substrate surface Wf to wash the chemical away. Thereafter, a drying processing of removing the pure water remaining on the substrate surface Wf is performed (processing step). Specifically, after the supply nozzle 121 is moved away to the standby position, the opening/closing valve 173 is opened with the substrate W kept rotating, whereby the gas injection from the gas injection port 293 formed in the circumference of the gas injection head 200 is started (Step S104). Subsequently, the opening/closing valve 171 is opened and the supply of the nitrogen gas toward the substrate surface Wf from the gas discharge port 283 formed in the lower surface of the gas injection head 200 is started (Step S105).

The flow velocity of the nitrogen gas supplied from the gas injection port 293 is fast and the injection direction is narrowed down in the vertical direction, whereby a curtain of gas radially flowing from the central part to the periphery above the substrate W is formed. On the other hand, the flow velocity of the nitrogen gas supplied from the gas discharge port 283 is slower than this, and the flow rate is restricted so as not to generate a strong flow toward the substrate surface Wf. Thus, the nitrogen gas supplied from the gas discharge port 283 acts to purge the air remaining in the space enclosed by a curtain-like gas layer injected from the gas injection port 293 and the substrate surface Wf and to maintain a nitrogen atmosphere in this space. Accordingly, the gas supplied from the gas injection port 293 is called "gas for curtain", whereas the gas discharged from the gas discharge port 283 is called "gas for purge".

With the gas curtain formed above the substrate W and the substrate surface Wf kept in the nitrogen atmosphere, the rotation speed of the spin chuck 101 is increased to rotate the substrate W at high speed (Step S106), and the substrate is dried by swishing the pure water on the substrate surface Wf off. During the drying processing, the adhesion of mist and the like to the dried substrate surface Wf and oxidation are prevented by continuing to supply the gas for curtain and the gas for purge. When the drying processing is completed, the rotation of the spin chuck 101 is stopped (Step S107) and the supplies of the gas for purge and the gas for curtain are successively stopped (Steps S108, S109). Then, the substrate conveyor robot 13 takes the dried substrate W from the spin chuck and unloads to the outside of the unit (Step S110), thereby completing the processings for one substrate. By repeating the above processings, a plurality of substrates can be successively processed.

As described above, in this embodiment, the gas injection head 200 is arranged above the substantial center of the substrate W and the curtain-like strong gas flow flowing from the central part to the outside is generated above the substrate in the processing unit for processing the substantially horizontally held substrate while rotating it. Thus, dust, mist and the like flown to the vicinity of the substrate W are ejected from the above of the substrate while moving together with the gas flow and do not adhere to the substrate. Further, since the gas injection head 200 can have a smaller diameter than the substrate W and needs not be largely retracted or rotated, the processing unit can be miniaturized. Furthermore, since the nitrogen gas is further supplied to the substrate surface Wf blocked from the surrounding atmosphere by the curtain-like gas flow, the oxidation of the substrate is prevented by keeping the substrate surface in the nitrogen gas atmosphere.

Further, the gas injection head 200 is constructed such that the pressurized nitrogen gas supplied from the nitrogen gas supply source GS is stored in the buffer space BF and is injected from the slit-shaped gas injection port 293 extending in the horizontal direction. By such a construction, the gas flow having the injection direction restricted in the vertical direction and isotropic in the horizontal direction can be realized by a relatively simple apparatus construction.

Second Embodiment

Next, a second embodiment of the processing unit as the substrate processing apparatus according to the invention is described. This embodiment differs from the first embodiment in additionally including a nozzle for supplying the processing liquid to the gas injection head. Except this point, the basic apparatus construction is the same as in the first embodiment. Accordingly, in the following description, the same construction as in the first embodiment is not described by being identified by the same reference numerals and characteristic parts of this embodiment are intensively described.

Figure 7:
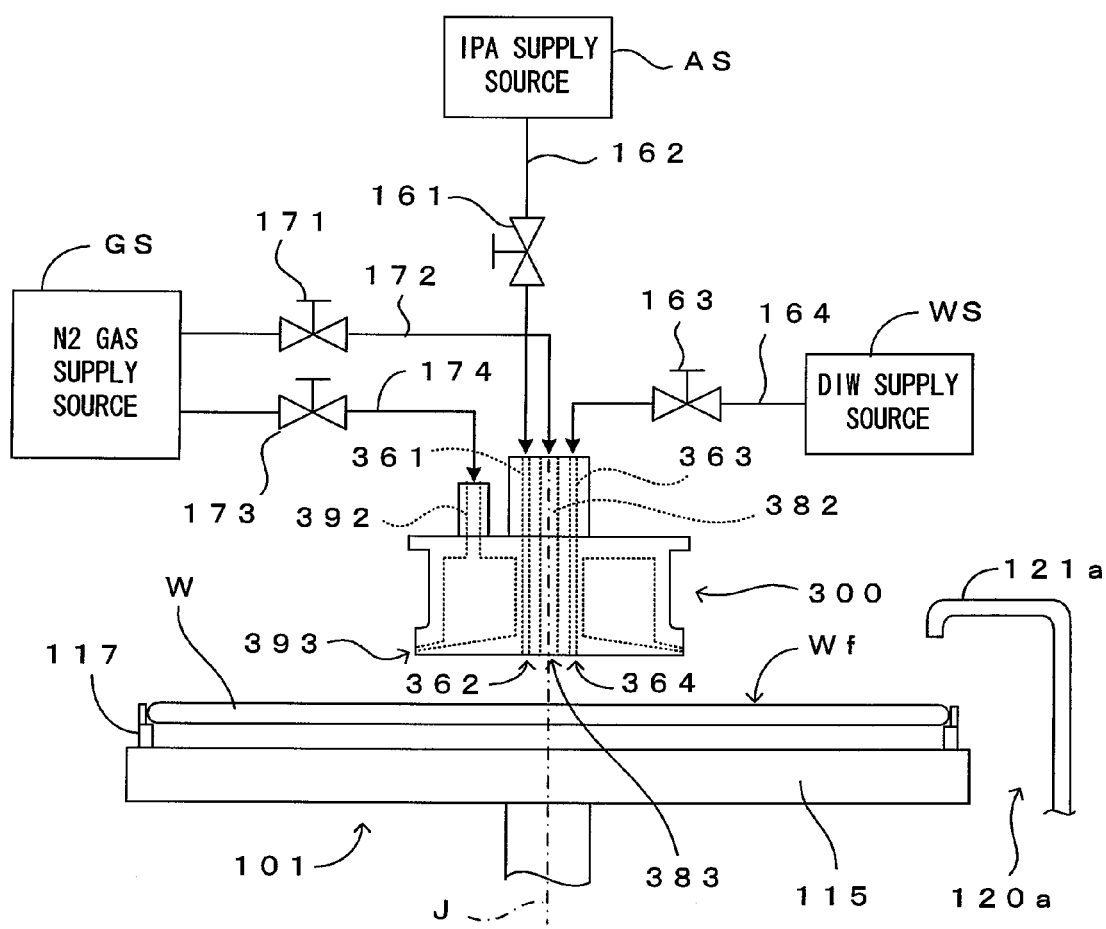
FIG. 7 is a diagram showing the second embodiment of the processing unit according to the invention.

FIG. 7 is a diagram showing the second embodiment of the processing unit according to the invention. In this embodiment, a gas injection head 300 is arranged above a substantial center of a substrate W held by a spin chuck 101. In the gas injection head 300, identified by 382, 383, 392 and 393 are respectively constructions corresponding to the gas supply passage 282, the gas discharge port 283, the gas supply passage 292 and the gas injection port 293 in the first embodiment, and the structures and functions thereof are also equivalent to those of the corresponding constructions in the first embodiment.

Supply passages 361, 363 are further formed to vertically penetrate the gas injection head 300. More specifically, the upper end of the supply passage 361 is connected to an external IPA supply source AS for supplying an isopropyl alcohol (IPA) liquid via a pipe 162 having an opening/closing valve 161 inserted therein, which valve is controllably opened and closed by a valve control mechanism 152. The bottom end of the supply passage 361 is open toward a substrate surface Wf at the lower surface of the gas injection head 300, thereby forming a discharge nozzle 362 for discharging the IPA. The upper end of the supply passage 363 is connected to an external deionized water (DIW) supply source WS via a pipe 164 having an opening/closing valve 163 inserted therein, which valve is controllably opened and closed by the valve control mechanism 152. The bottom end of the supply passage 363 is open toward the substrate surface Wf at the lower surface of the gas injection head 300, thereby forming a discharge nozzle 364 for discharging the DIW. In the thus constructed processing unit of the second embodiment, a rinsing liquid used for a rinsing processing after a chemical processing and the IPA as a displacement liquid to substitute the rinsing liquid to promote the drying are supplied to the substrate surface Wf from the gas injection head 300.

Figure 8:
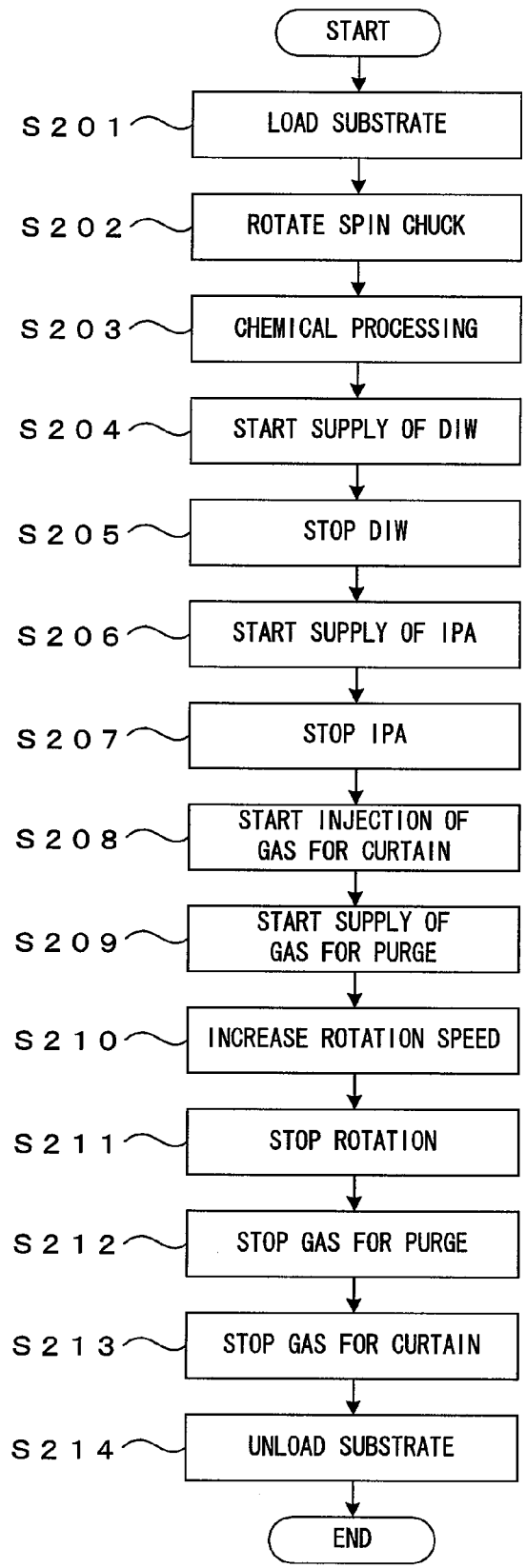
FIG. 8 is a flow chart showing the flow of substrate processings in the second embodiment.

FIG. 8 is a flow chart showing the flow of substrate processings in the second embodiment. This flow is the same as in the first embodiment until the substrate is loaded into the unit and the spin chuck is rotated (Steps S201 to S202). Subsequently, the chemical is supplied from a processing liquid nozzle 121a provided in a processing liquid supplier 120a to apply a specified chemical processing to the substrate (Step S203). Then, the supply of the chemical is stopped, the supply nozzle 121a is moved to a standby position and the opening/closing valve 163 is opened, whereby the DIW is supplied from a discharge nozzle 364 to the substrate surface Wf (Step S204). In this way, the chemical on the substrate surface is washed away by the DIW (rinsing processing).

After the supply of the DIW is continued for a predetermined time, it is stopped by closing the opening/closing valve 163 (Step S205) and the opening/closing valve 161 is opened instead to discharge the IPA from the discharge nozzle 362 (Step S206). The IPA is blended into the DIW remaining on the substrate surface Wf to substitute for the DIW to reduce surface tension, whereby the liquid on the substrate surface can be better swished off. Thereafter, the supply of the IPA is stopped (Step S207). Then, similar to the first embodiment, the supplies of gas for curtain and gas for purge are successively started (Steps S208, S209). The liquid remaining on the substrate surface is swished off by the rotation of the substrate to dry the substrate surface Wf. Since the nitrogen atmosphere is kept near the substrate surface at this time, the oxidation of the substrate surface Wf exposed by the removal of the remaining liquid is prevented. When the drying of the substrate surface is completed, the substrate is rotated at high speed and then the rotation is stopped (Steps S210, S211), the supplies of the gas for purge and the gas for curtain are stopped (Steps S212, S213) and the substrate is unloaded to the outside of the processing unit to end the processing (Step S214) similar to the first embodiment.

As described above, in the processing unit of the second embodiment, a radial gas flow is generated from the central part to the outer side above the substrate similar to the first embodiment. Thus, the adhesion of dust, mist and the like flying toward the substrate surface Wf to the substrate surface during the processing can be prevented. The other functions and effects mentioned in the description of the first embodiment can be similarly obtained also in this embodiment. Since the nozzles for supplying the DIW and the IPA are provided in the gas injection head 300, the entire processing unit can have a smaller construction. Further, the DIW and the IPA can be supplied to the substantial center of the substrate W with the gas injection head 300 arranged right above the substrate W.

<Miscellaneous>

As described above, in the above respective embodiments, the spin chuck 101 functions as a "substrate holder" of the invention, whereas the gas injection heads 200, 300 function as a "gas injector" of the invention. Further, the gas discharge port 283 in the first embodiment and the gas discharge port 383, the discharge nozzles 362 and 363 in the second embodiment function as a "fluid discharger" of the invention.

The invention is not limited to the above embodiments and various changes other than the above can be made without departing from the gist thereof. For example, in the gas injection head 200 of the first embodiment, the shim 221 is sandwiched between the upper member 201 and the lower member 202 to define the gap between the opening end surface 201a of the upper member 201 and the flange peripheral portion 202b of the lower member 202 and this gap serves as the slit-shaped gas injection port 293. However, the gas injection port may be formed, for example, as follows.

Figure 9A:
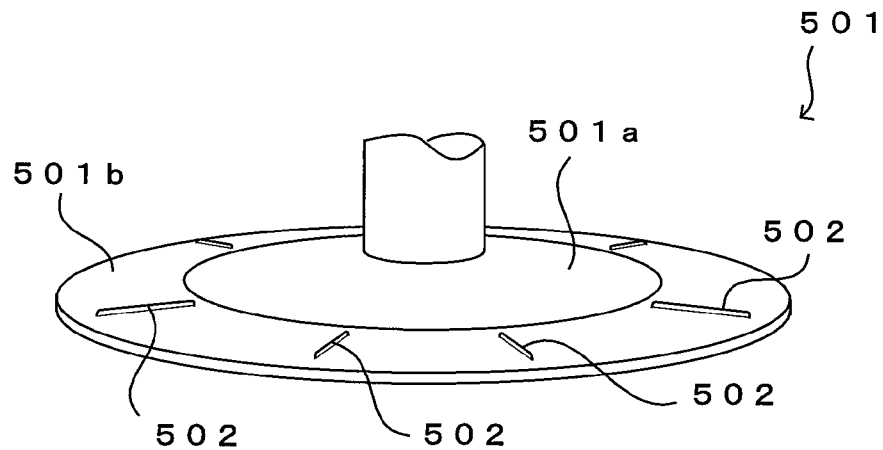
FIGS. 9A and 9B are diagrams showing other examples of the construction for forming the gas injection port.
Figure 9B:
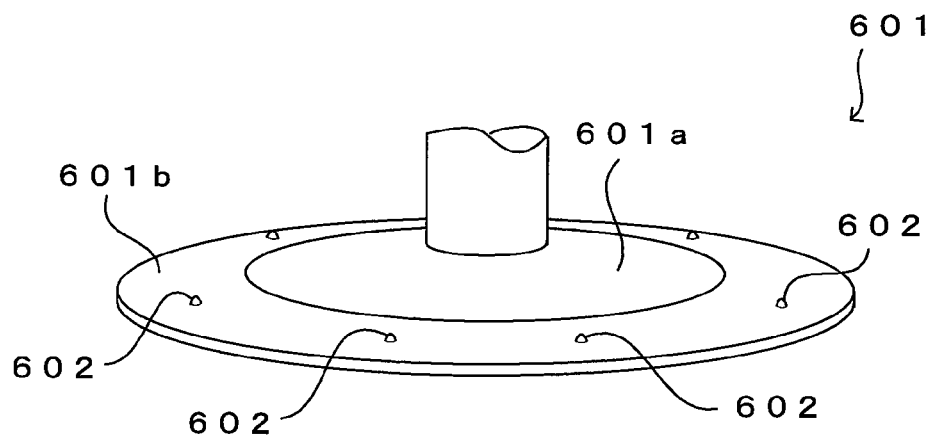

FIGS. 9A and 9B are diagrams showing other examples of the construction for forming the gas injection port. More specifically, FIGS. 9A and 9B are diagrams showing other examples of the shape of the lower member for forming the slit-shaped gas injection port. In a lower member 501 shown in FIG. 9A, a plurality of ribs 502 are radially provided on a peripheral portion 501b of a flange 501a. The lower member 501 having such a shape is attached to the upper member 201 instead of the lower member 202 in the first embodiment and the upper ends of the ribs 502 are brought into contact with the opening end surface 201a of the upper member 201, whereby a gap corresponding to the height of the ribs is formed between the upper and lower members. By doing so, a desired gap can be formed without using the shim and making any adjustment and the gas can be radially injected from this gap. In a lower member 601 shown in FIG. 9B, a plurality of projections 602 are provided on a peripheral portion 601b of a flange 601a instead of the ribs. A similar effect can be obtained with this construction. The plurality of projections may be arranged in a so-called offset manner by making the positions thereof differ in the circumferential direction. Further, these ribs and projections may be formed on the opening end surface of the upper member.

Although the gas injection heads 200, 300 are made of metal such as stainless steel or aluminum in the above respective embodiments, the gas injection heads, particularly the lower members may be made of resin. By doing so, the gas injection heads can be made lighter and have improved chemical resistance. Resin materials applicable for such a purpose include polyether ether ketone (PEEK), polyvinyl chloride (PVC), polychlorotrifluoroethylene (PCTFE), etc.

Although the nitrogen gas atmosphere is maintained near the substrate surface by discharging the nitrogen gas from the lower surface of the gas injection head in the above respective embodiments, this construction is not essential to realize a basic concept of the invention to block the vicinity of the substrate surface from the external atmosphere and scattered mist and the like by means of the gas flow. Accordingly, if the entire interior of the processing chamber is, for example, controlled to have an inert gas atmosphere, it may be omitted to discharge the nitrogen gas from the lower surface of the gas injection head and/or another gas may be discharged.

Although the discharge nozzles for supplying the DIW and the IPA to the substrate are provided in the gas injection head 300 in the above second embodiment, the fluids discharged from the discharge nozzles provided in the gas injection head are not limited to these. For example, a nozzle for supplying the chemical for the chemical processing to the substrate may be additionally provided in the gas injection head or only some of these discharge nozzles may be provided.

Although the nitrogen gas supplied from the single nitrogen gas supply source GS is discharged respectively from the gas discharge port provided in the side surface of the gas injection head and the gas discharge port provided in the lower surface in the above respective embodiments, the invention is not limited to such a construction. For example, different gas supply sources may be provided. The gas to be discharged may be, for example, other than the nitrogen gas, but is desirably inert gas so as not to adversely affect the substrate. However, in the case of such a construction that the gas injected from the gas injection port provided in the side surface of the gas injection head does not reach the substrate surface as described above, it is possible to use, for example, dry air or gas other than inert gas as the gas to be injected from the gas injection port.

Although the head elevating mechanism 153 is provided and convenience in loading and unloading the substrate is improved by vertically moving the gas injection head 200 or 300 in the above respective embodiments, such a mechanism is not an essential construction in the concept of the invention. For example, if there is no interference between the substrate conveyor robot 13 and the gas injection head upon loading and unloading the substrate, the head elevating mechanism may be omitted and the gas injection head may be fixed. If such a construction can be employed, the processing unit can be made even smaller.

Although the supply of the gas for curtain is started after the supply of the IPA is stopped in the second embodiment, the supply of the gas for curtain may be alternatively started upon supplying the DIW or IPA to the substrate W from the gas injection head 300 and the gas for purge may be supplied after the supply of the IPA is stopped. By doing so, the entrance of dust and the like into the space above the substrate can be prevented already before the drying processing.

The invention is not limited to the above embodiments and is applicable to substrate processing apparatuses and substrate processing methods in general for applying a specified processing with the substrate substantially horizontally held. Here, substrates to be processed include semiconductor wafers, glass substrates for photomasks, glass substrates for liquid crystal displays, glass substrates for plasma displays, substrates for FEDs (Field Emission Displays), substrates for optical discs, substrates for magnetic discs and substrates for magneto-optical discs. The processings to be applied to the substrate include a development processing, an etching processing, a cleaning process, a rinsing processing and a drying processing. The invention can be suitably applied not only to substrate processing systems including a plurality of processing units as in the above embodiments, but also to substrate processing systems including only one pair of substrate holder and gas injector.

The substrate processing apparatus according to the invention is preferably constructed such that an injection port for injecting gas is provided in an outer peripheral portion of the gas injector and that a center line of a gas injection range from the injection port in a vertical direction is located between a horizontal line and a straight line connecting the injection port and the substrate peripheral edge. By doing so, dust, mist and the like moving together with the gas flow is sent to the outer side of the substrate peripheral portion without being stirred up and adhering to the upper surface of the substrate. Therefore, the adhesion of dust, mist and the like to the substrate can be effectively suppressed.

The gas injector may be internally provided with a buffer space for temporarily storing pressurized gas and may inject the gas stored in the buffer space through the injection port formed to have a slit shape extending substantially in a horizontal direction. By doing so, the gas can be injected at high speed from the slit-shaped injection port isotropically in the horizontal direction with an injection direction narrowed down in the vertical direction.

For example, the gas injector may include an upper member which is formed with a cavity having an open bottom side and a lower member which is adapted to cover the opening of the upper member and having a facing surface facing an opening end surface of the upper member, and the injection port is formed by arranging the opening end surface of the upper member and the facing surface of the lower member to face each other with a specified gap defined therebetween. By doing so, the cavity enclosed by the upper member and the lower member can be caused to function as the buffer space, whereas the gap between the upper member and the lower member can be caused to function as the slit-shaped injection port.

In the substrate processing apparatus constructed as described above, an outer diameter of the gas injector is preferably smaller than that of the substrate. As described above, since the blocking effect is obtained by injecting the gas from the above of the substantial center of the substrate toward the surrounding in the invention, the gas injector can be miniaturized. Particularly, the outer diameter of the gas injector can be made smaller than that of the substrate, whereby the apparatus can be made smaller as compared with the case where a blocking plate for covering the entire substrate is provided. The outer diameter of the gas injector is preferably set smaller than half the outer diameter of the substrate.

The gas injector may further include a fluid discharger for discharging a processing fluid toward the substantial center of the upper surface of the substrate held by the substrate holder. By doing so, the gas injector for generating the gas flow can have a function of supplying the processing fluid to the substrate additionally, wherefore the apparatus can be made even smaller.

The substrate holder may rotate the substrate about a rotation axis center extending substantially in the vertical direction. By doing so, the processing can be performed while the substrate is rotated, wherefore the substrate surface can be uniformly processed. Further, the processing fluid adhering to the substrate can be removed from the substrate surface by a centrifugal force. In this case, it does not enlarge the apparatus to provide the gas injector since the gas injector needs not be rotated together with the substrate.

The gas injector may inject inert gas as the gas. By doing so, the inert gas is supplied to the vicinity of the upper surface of the substrate, whereby the exposure of the substrate surface to outside air can be suppressed.

When the specified processing includes a drying processing for drying the substrate after a wet processing in the substrate processing method according to the invention, the injection of the gas is preferably continued until the drying processing is completed in the processing step. By doing so, the return of the processing liquid removed from the substrate surface to the substrate can be prevented. If the gas to be injected at this time is inert gas, the oxidation of the dried substrate by being exposed to outside air can be prevented.

According to the invention, since a layer of gas flow thin in the vertical direction and substantially isotropically flowing in the horizontal direction from the above of the substantial center of the substrate toward the outer side is generated and the upper surface of the substrate is covered by this gas flow, the adhesion of dust falling down from the above of the substrate and mist and the like scattered around the substrate to the substrate can be prevented. As compared with the blocking plate for covering the entire substrate, means for injecting the gas (gas injector) can have a smaller construction and it is not necessary to rotate or move this, wherefore the apparatus can be miniaturized.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus for applying a specified processing to a substrate, comprising:
    a substrate holder which holds the substrate substantially horizontally, and
    a gas injector which is arranged above a substantial center of the substrate held by the substrate holder and radially injects gas,
    wherein the gas injector injects the gas substantially isotropically in a horizontal direction while restricting an injection direction of the gas to a specified range in a vertical direction; and
    wherein an injection port for injecting the gas is provided in an outer peripheral portion of the gas injector, the injection port being configured such that a center line of a gas injection range from the injection port in the vertical direction is located between a horizontal line, and a straight line connecting the injection port and a substrate peripheral edge.

2. The substrate processing apparatus according to claim 1, wherein the gas injector is internally provided with a buffer space for temporarily storing pressurized gas and injects the gas stored in the buffer space through the injection port formed to have a slit shape extending substantially in a horizontal direction.

3. The substrate processing apparatus according to claim 2, wherein the gas injector includes:
    an upper member which is formed with a cavity having an open bottom side; and
    a lower member which is adapted to cover the opening of the upper member and having a facing surface facing an opening end surface of the upper member, and wherein the injection port is formed by arranging the opening end surface of the upper member and the facing surface of the lower member to face each other with a specified gap defined therebetween.

4. The substrate processing apparatus according to claim 1, wherein an outer diameter of the gas injector is smaller than that of the substrate.

5. The substrate processing apparatus according to claim 1, wherein the gas injector further includes a fluid discharger for discharging a processing fluid toward the substantial center of the upper surface of the substrate held by the substrate holder.

6. The substrate processing apparatus according to claim 1, wherein the substrate holder rotates the substrate about a rotation axis center extending substantially in the vertical direction.

7. The substrate processing apparatus according to claim 1, wherein the gas injector injects inert gas as the gas.

8. A substrate processing method, comprising:
    a substrate holding step of substantially horizontally holding a substrate, and
    a processing step of applying a specified processing to the substrate by injecting gas, from the above of a substantial central part of the substrate, substantially isotropically in a horizontal direction while restricting an injection direction to a specified range in a vertical direction; and
    providing an injection port for injecting the gas in an outer peripheral portion of the gas, injector, the injection port being configured such that a center line of a gas injection range from the injection port in the vertical direction is located between a horizontal line, and a straight line connecting the injection port and a substrate peripheral edge.

9. A substrate processing method according to claim 8, wherein the specified processing includes a drying processing for drying the substrate after a wet processing, and the injection of the gas is continued until the drying processing is completed in the processing step.

* * * * *